United States Patent
Le et al.

(10) Patent No.: US 11,606,637 B2
(45) Date of Patent: Mar. 14, 2023

(54) WIRELESS LISTENING DEVICE

(71) Applicant: Apple Inc., Cupertino, CA (US)

(72) Inventors: Duy P. Le, Los Angeles, CA (US); Ryan Ott, Los Angeles, CA (US); Robert A. Boyd, Los Angeles, CA (US); Christina J. Smiechowski, Los Angeles, CA (US); Kjell F. Ekman, Los Angeles, CA (US); Yufan Liao, Cupertino, CA (US); Wenjie Zhuang, Los Angeles, CA (US)

(73) Assignee: APPLE INC., Cupertino, CA (US)

( * ) Notice: Subject to any disclaimer, the term of this patent is extended or adjusted under 35 U.S.C. 154(b) by 46 days.

(21) Appl. No.: 17/223,655

(22) Filed: Apr. 6, 2021

(65) Prior Publication Data

US 2022/0279263 A1    Sep. 1, 2022

Related U.S. Application Data

(60) Provisional application No. 63/154,406, filed on Feb. 26, 2021.

(51) Int. Cl.
*H04R 1/10* (2006.01)
*H05K 5/00* (2006.01)

(52) U.S. Cl.
CPC ......... *H04R 1/1016* (2013.01); *H04R 1/1025* (2013.01); *H04R 1/1041* (2013.01);
(Continued)

(58) Field of Classification Search
CPC .. H04R 1/1041; H04R 25/603; H04R 25/453; H04R 2225/61; H02J 7/0044
See application file for complete search history.

(56) References Cited

U.S. PATENT DOCUMENTS

| | | | |
|---|---|---|---|
| 6,919,519 B2* | 7/2005 | Ravnkilde | H01H 1/16 200/16 A |
| 8,094,851 B2* | 1/2012 | Heerlein | H04R 25/00 381/312 |

(Continued)

FOREIGN PATENT DOCUMENTS

| | | | |
|---|---|---|---|
| CN | 210670516 U | * 6/2020 | |
| DE | 102006018631 A1 | * 10/2007 | H01H 23/14 |

(Continued)

OTHER PUBLICATIONS

"BeatX" Pictures, Available Online at:https://www.cnet.com/pictures/beatsx-earphones-photos/2/ in 3 pages.
(Continued)

*Primary Examiner* — Ryan Robinson
(74) *Attorney, Agent, or Firm* — Kilpatrick Townsend & Stockton LLP

(57) ABSTRACT

A portable listening device comprising: a device housing defining an internal cavity; an acoustic port formed through the device housing; an audio driver disposed within the device housing and aligned to emit sound through the acoustic port; a multifunction input button coupled to the device housing, the multifunction input button having a distal end and a proximate end, a centerline between the distal and proximate ends and an axis of rotation located between the center line and the proximate end; an electronic circuit disposed within the device housing that requires power to operate and is configured to detect activation of the button; and a battery disposed within the device housing and operable to provide power to the electronic circuit.

17 Claims, 10 Drawing Sheets

(52) U.S. Cl.
CPC ..... *H05K 5/0086* (2013.01); *H04R 2201/103* (2013.01); *H04R 2420/07* (2013.01); *H04R 2460/11* (2013.01)

(56) References Cited

U.S. PATENT DOCUMENTS

| | | | |
|---|---|---|---|
| 8,249,287 B2 | 8/2012 | Silvestri et al. | |
| 8,314,354 B2* | 11/2012 | Prest | H01H 13/76 |
| | | | 200/406 |
| 9,036,853 B2 | 5/2015 | Silvestri et al. | |
| 9,131,311 B2* | 9/2015 | Lumsden | A61F 11/08 |
| 9,596,532 B2* | 3/2017 | Rye | H04R 1/105 |
| 9,712,932 B2* | 7/2017 | Dundas | H04R 25/552 |
| 9,723,416 B2* | 8/2017 | Babico | H04R 25/50 |
| 9,805,590 B2* | 10/2017 | Shennib | G08C 17/02 |
| 9,980,063 B2* | 5/2018 | Johnson | H04R 25/603 |
| 9,992,589 B2* | 6/2018 | Ochsenbein | H04R 25/65 |
| 10,097,913 B2 | 10/2018 | Zorkendorfer et al. | |
| 10,206,474 B2* | 2/2019 | Brzezinski | H02J 50/402 |
| 10,433,045 B2 | 10/2019 | Trainer et al. | |
| 10,602,255 B2 | 3/2020 | Sandanger | |
| 11,245,974 B2* | 2/2022 | Guo | H04R 1/1025 |
| 11,245,989 B2* | 2/2022 | Nielsen | H04R 25/603 |
| 11,368,795 B2* | 6/2022 | Nielsen | H04R 25/02 |
| 11,375,058 B2* | 6/2022 | Kuzhiyil | H04M 1/72442 |
| 11,425,479 B2* | 8/2022 | Liu | H04R 1/1016 |
| 2009/0073950 A1* | 3/2009 | Guccione | H04R 1/1058 |
| | | | 370/254 |
| 2011/0176699 A1 | 7/2011 | Lin | |
| 2014/0088504 A1* | 3/2014 | King | A61M 5/3159 |
| | | | 604/131 |
| 2015/0350764 A1 | 12/2015 | Briggs | |
| 2016/0073186 A1 | 3/2016 | Searl et al. | |
| 2018/0070165 A1 | 3/2018 | Hatfield et al. | |
| 2020/0107099 A1 | 4/2020 | McIntosh | |

FOREIGN PATENT DOCUMENTS

| | | | | |
|---|---|---|---|---|
| DE | 102008038212 A1 | * | 12/2009 | ............. H04R 25/60 |
| DE | 102009012630 A1 | * | 9/2010 | ............. H01H 23/14 |
| DE | 102012211583 A1 | * | 8/2013 | ........... H04R 25/656 |
| DE | 102019214158 A1 | * | 6/2020 | |
| EP | 2063665 A2 | * | 5/2009 | ............. H01H 25/06 |
| WO | WO-2022148347 A1 | * | 7/2022 | ............... H04R 1/10 |

OTHER PUBLICATIONS

"Google Pixel Buds" Product Pictures, Available Online at: https://store.google.com/us/product/pixel_buds?hl=en-US in 3 pages.

"Jaybirdsport" Pictures, Available Online at https://www.jaybirdsport.com/en-us/vista.985-000865.html in 2 pages.

"SoundReview" Pictures, Available Online at: https://soundreview.org/audio/beats-tour-2-sports-review/ in 2 pages.

* cited by examiner

WIRELESS LISTENING DEVICE

CROSS-REFERENCE TO RELATED APPLICATIONS

This application claims the benefit of priority under 35 U.S.C. § 119(e) of U.S. Provisional Patent Application No. 63/154,406, entitled "Wireless Listening Device," filed on Feb. 26, 2021, which is hereby incorporated by reference in its entirety.

BACKGROUND

Portable listening devices, such as headphones, can be used with a wide variety of electronic devices such as portable media players, smart phones, tablet computers, laptop computers, stereo systems, and other types of devices. Portable listening devices have historically included one or more small speakers configured to be place on, in, or near a user's ear, structural components that hold the speakers in place, and a cable that electrically connects the portable listening device to an audio source.

Wireless portable listening devices that do not include a cable and instead, wirelessly receive a stream of audio data from a wireless audio source, have become ubiquitous. Such wireless portable listening devices can include, for instance, wireless earbud devices or wireless in-ear hearing devices that operate in pairs (one for each ear) or individually for outputting sound to, and receiving sound from, the user.

While wireless portable listening devices have many advantages over wired portable listening devices and have become a very popular with consumers, improved wireless portable listening devices are desirable.

BRIEF SUMMARY

The present disclosure describes various embodiments of portable listening devices that can enable a user to experience high-end acoustic performance and a pleasant, positive user experience as well as various embodiments of a case for storing and/or charging one or more portable listening devices.

According to some embodiments, a portable listening device includes: a device housing defining an internal cavity; an acoustic port formed through the device housing; an audio driver disposed within the device housing and aligned to emit sound through the acoustic port; a multifunction input button coupled to the device housing, the multifunction input button having a distal end and a proximate end, a centerline between the distal and proximate ends and an axis of rotation located between the center line and the proximate end; an electronic circuit disposed within the device housing that requires power to operate and is configured to detect activation of the button; and a battery disposed within the device housing and operable to provide power to the electronic circuit.

In various implementations, the portable listening device can further include one or more of the following features. The multifunction button can include a faceplate coupled to a button housing element. The faceplate can define an exterior surface of the portable wireless listening device and the button housing element can be part of the device housing. The faceplate can be coupled to the bottom housing element by a retention clip at the distal end of the multifunction button and by a wireform axle at the proximal end of the multifunction button. The faceplate can include a plunger located between the centerline and the distal end and the multifunction input button can include a switch disposed underneath the plunger. The faceplate can have a generally planar outer surface and an oval shape. The multifunction input button can further include a gasket disposed between the faceplate and button housing element at a location between the centerline and the proximate end. The gasket can provide internal spacing between the faceplate and the button housing element and can be operatively coupled to bias the faceplate away from the button housing element. The gasket can include first and second legs at opposing ends of the gasket and the portable wireless listening device can further include a mesh disposed between the first and second legs and a microphone port formed through button housing element directly beneath the mesh. The portable wireless listening device can include a wireless antenna disposed between the faceplate and the button housing element. The internal cavity can include a front volume and a back volume for the audio driver. A feedback microphone can be positioned within the front volume. A voice microphone and a feed forward microphone can be positioned within the back volume. The device housing can include a nozzle that defines the acoustic port at a first end of the device housing and a deformable ear tip can be removably coupled to the nozzle. The multifunction input button can be disposed at a second end of the device housing opposite the first end where the nozzle is positioned.

According to some embodiments, a charging case for a portable wireless listening devices includes a case body having a pocket configured to receive the portable wireless listening device. The pocket can include an opening at an upper surface of the case body, an upper section extending from the opening to a first depth within the case body, a lower section extending from the opening to a second depth within the case body that is greater than the first depth, and a trough extending at a downward angle from the upper section to the lower section. The charging case can further include a lid attached to the case body and operable between a closed position where the lid is aligned over the pocket and an open position that enables the portable wireless listening device to be placed in or removed from the pocket; first and second electrical contacts disposed within the pocket on opposite sides of the trough; a battery; and a charging system operatively coupled to the battery and configured to charge the portable wireless listening device through the first and second electrical contacts.

In various implementations, case can have one or more of the following features. The pocket can be a first pocket having a first opening at the upper surface of the case body, and the case body can include a second pocket having a second opening at the upper surface of the case body spaced apart from the first opening. The second pocket can include a second upper section extending from the second opening to the first depth within the case body, a second lower section extending from the second opening to the second depth within the case body, and a second trough extending at a downward angle from the second upper section to the second lower section. A user-interface button can be disposed at an upper surface of the case body between the first and second pockets. The user interface button can be configured to, when activated and when the in-ear headphones are stored within the case, initiate a pairing routine that allows the in-ear headphones to be paired with a host device. The lid can be coupled to the body by a bistable hinge that has first and second stable states in which the first state the lid is in an opened position with respect to the body and in the second state the lid is in a closed position with respect to the body.

According to some embodiments, a portable wireless listening system is provided. The system can include a pair of earphones including a first earphone and a second earphone and a case for storing and charging the pair of earphones. Each of the first and second earphones can include: an earphone device housing defining an internal cavity for the earphone; an acoustic port formed through the earphone housing; an audio driver disposed within the earphone housing and aligned to emit sound through the acoustic port; one or more electronic circuits disposed within the earphone housing that require power to operate; a battery disposed within the earphone housing and operable to provide power to the electronic circuit; and a retention magnet disposed within the earphone housing, wherein the retention magnet for the first earphone is positioned within the first earphone housing such that its north and south poles are aligned in a first orientation and the retention magnet for the second earphone is positioned within the second earphone housing such that its north and south poles are aligned in a second orientation, opposite the first orientation. The case can include: a case body having a first pocket sized and shaped to receive the first earphone and a second pocket sized and shaped to receive the second earphone; a lid attached to the case body and operable between a closed position where the lid is aligned over the first and second pockets and an open position that enables the first and second earphones to be placed in or removed from their respective pocket; a case battery; a charging system operatively coupled to the battery and configured to charge the first and second earphones when the earphones are positioned within their respective pockets; and first and second retention elements, the first retention element positioned within the case body adjacent to the first pocket and aligned to magnetically coupled with the retention magnet of one of the earphones in the pair of earphones when the earphone is placed in the first pocket, the second retention element positioned within the case body adjacent to the second pocket and aligned to magnetically coupled with one of the pair of earphones when the earphone is placed in the second pocket. The first retention element generates a magnetic field that attracts the first retention magnet when the first earphone is placed in the first pocket and a magnetic field that repels the second earphone when the second earphone is placed in the first pocket, and the second retention element generates a magnetic field that attracts the second retention magnet when the second earphone is placed in the second pocket and a magnetic field that repels the first earphone when the first earphone is placed in the second pocket.

In various implementations, the portable listening device system can include one or more of the following features. Each of the first and second retention elements can comprise a shunt and first and second magnets spaced apart from each other and disposed between the shunt and their respective pockets. The shunt for each of the first and second retention elements can include a first portion and a second portion bent at an angle with respect to the first portion and wherein one of the first and second magnets is coupled to the first portion of the shunt and the other of the first and second magnets is coupled to the second portion of the shunt enabling the first and second magnets to be generally aligned with a curvature of their respective pocket. The first and second magnets in the first retention element can be positioned in a mirrored relationship with respect to the first and second magnets in the second retention element with the poles of the first and second magnets in the first retention element flipped with respect to the poles of the first and second magnets in the second retention element. Each of the first and second retention elements can further include a third magnet disposed between the first and second magnets. The third magnet can have a magnetic polarity aligned to pull flux out of one of the first and second magnets and push the pulled flux into the other of the first and second magnets.

To better understand the nature and advantages of the present invention, reference should be made to the following description and the accompanying figures. It is to be understood, however, that each of the figures is provided for the purpose of illustration only and is not intended as a definition of the limits of the scope of the present invention. Also, as a general rule, and unless it is evident to the contrary from the description, where elements in different figures use identical reference numbers, the elements are generally either identical or at least similar in function or purpose.

DETAILED DESCRIPTION

Figure 1:
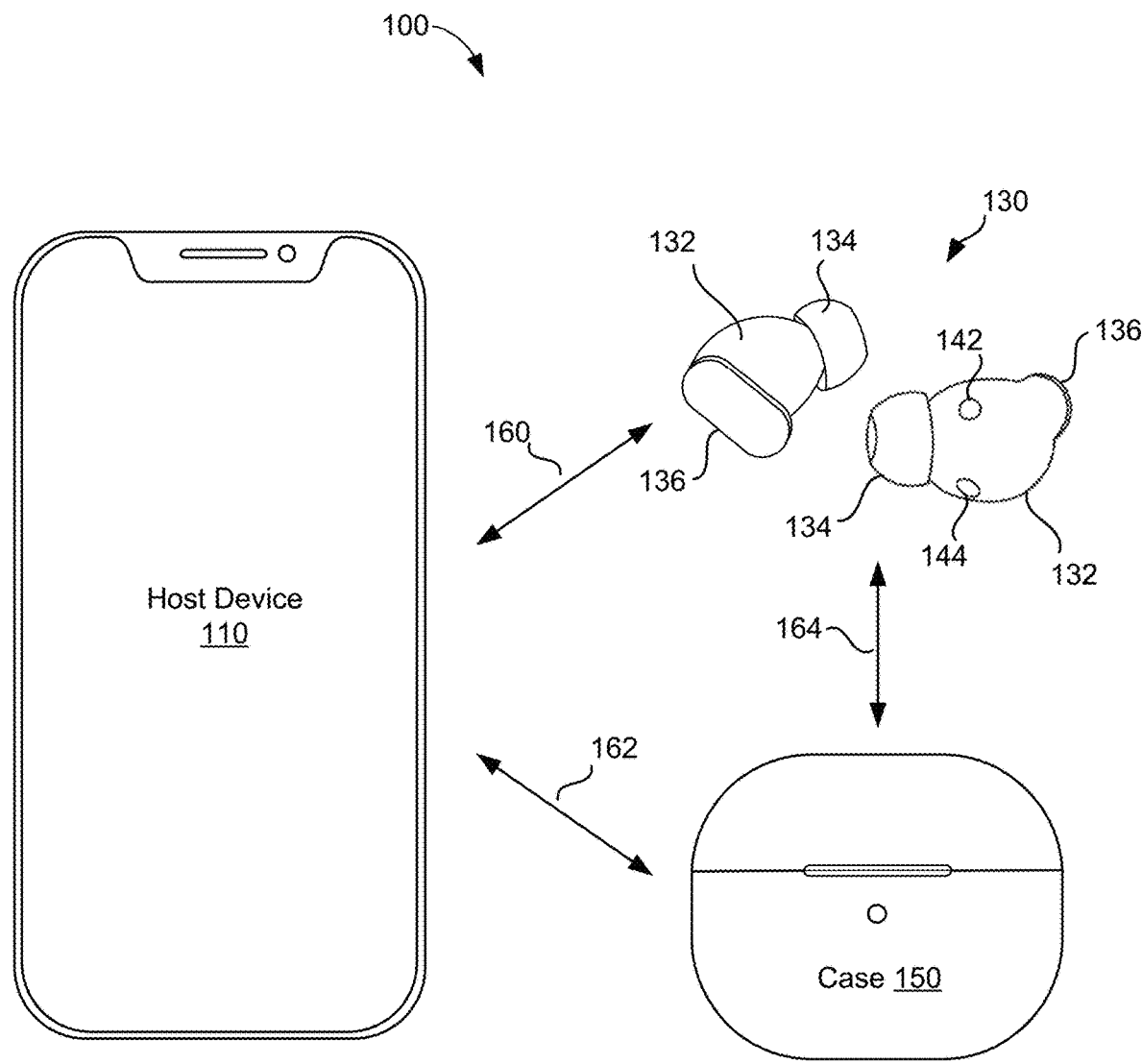
FIG. 1 is a simplified illustration of an exemplary portable electronic listening device system having a host device configured as a smart phone, a case, and a pair of wireless listening devices configured as earphones, according to some embodiments.

Some embodiments of the disclosure pertain to a portable wireless listening that can deliver high-end acoustic performance to a user along with a pleasant and intuitive user experience. Other embodiments pertain to a case for charging and storing one or more portable wireless listening devices. Still other embodiments pertain to a system that includes both a pair of portable wireless listening devices and a charging case for the devices.

As used herein, the term "portable listening device" includes any portable device configured to be worn by a user and placed such that a speaker of the portable listening device is adjacent to or in a user's ear. A "portable wireless listening device" is a portable listening device that is able to receive and/or send streams of audio data from or to a second device without a wire connecting the portable wireless listening device to the second device using, for example, a wireless communication protocol.

Headphones are one type of portable listening device, headsets (a combination of a headphone and an attached microphone) are another and hearing aids (in-ear devices that are designed to augment sounds from the surrounding environment to improve a user's hearing) are still an additional type of portable listening device. The term "headphones" represents a pair of small, portable listening devices that are designed to be worn on or around a user's head. They convert an electrical signal to a corresponding sound that can be heard by the user. Headphones include traditional headphones that are worn over a user's head and include left and right ear cups connected to each other by a headband, and earphones (very small headphones that are designed to be fitted directly in a user's ear). Traditional headphones include both over-ear headphones (sometimes referred to as either circumaural or full-size headphones) that have ear pads that fully encompass a user's ears, and on-ear headphones (sometimes referred to as supra-aural headphones) that have ear pads that press against a user's ear instead of surrounding the ear.

The term "earphones", which can also be referred to as ear-fitting headphones, includes both small headphones, sometimes referred to as "earbuds", that fit within a user's outer ear facing the ear canal without being inserted into the ear canal, and in-ear headphones, sometimes referred to as canal phones, that are inserted in the ear canal itself. Thus, earphones can be another type of portable listening device that are configured to be positioned substantially within a user's ear. As used herein, the term "ear tip", which can also be referred to as ear mold, includes pre-formed, post-formed, or custom-molded sound-directing structures that at least partially fit within an ear canal. Ear tips can be formed to have a comfortable fit capable of being worn for long periods of time. They can have different sizes and shapes to achieve a better seal with a user's ear canal and/or ear cavity.

Example Wireless Listening System

FIG. 1 is an example of a wireless listening system 100 according to some embodiments. System 100 can include a host device 110, a pair of portable wireless listening devices 130 and a charging case 150. Host device 110 is depicted in FIG. 1 as a smart phone but can be any electronic device that can transmit audio data to portable listening device 130. Other, non-limiting examples of suitable host devices 110 include a laptop computer, a desktop computer, a tablet computer, a smart watch, an audio system, a video player, and the like.

As depicted graphically in FIG. 1, host device 110 can be wirelessly communicatively coupled with portable wireless listening devices 130 and charging case 150 through wireless communication links 160 and 162. Similarly, portable wireless listening devices 130 can be communicatively coupled to charging case 150 via wireless communication link 164. Each of the wireless communication links 160, 162 and 164 can be a known and established wireless communication protocol, such as a Bluetooth protocol, a WiFi protocol, or any other acceptable protocol that enables electronic devices to wirelessly communicate with each other. Thus, host device 110 can exchange data directly with portable wireless listening devices 130, such as audio data, that can be transmitted over wireless link 160 to wireless listening devices 130 for play back to a user, and audio data that can be received by host device 110 as recorded/inputted from microphones in the portable wireless listening devices 130. Host device 110 can also be wirelessly communicatively coupled with charging case 150 via wireless link 162 so that the host device 110 can exchange data with the charging case, such as data indicating the battery charge level data for case 150, data indicating the battery charge level for portable wireless listening devices 130, data indicating the pairing status of portable wireless listening devices 130.

Portable wireless listening devices 130 can be stored within case 150, which can protect the devices 130 from being lost and/or damaged when they are not in use and can also provide power to recharge the batteries of portable wireless listening devices 230 as discussed below.

According to some embodiments, each individual portable wireless listening device 130 can include a housing 132 having an ear tip 134 at one end of the housing and a multifunction button 136 positioned at an opposite end of the housing. Housing 132 can be formed of a monolithic outer structure and can include a nozzle (not visible in FIG. 1) to which ear tip 134 can be removably attached. In some embodiments, housing 132 can define an acoustic port through the nozzle that can direct sound from an internal audio driver out of housing 132, through ear tip 134 and into a user's ear canal. Ear tip 134 can be a deformable ear tip that can be inserted into a user's ear canal creating a seal within the user's ear canal and enabling the wireless listening devices 130 to have a noise canceling feature as described below.

As will be appreciated herein, portable wireless listening devices 130 can be sufficiently small and light that the devices to be comfortably worn by a user for extended periods of time and even all day. The wireless listening devices 130 can provide an audio interface to host device 110 so that the user may not need to utilize a graphical interface of host device 110. In other words, wireless listening devices 130 can be sufficiently sophisticated that they can enable the user to perform certain day-to-day operations from host device 110 solely through interactions with wireless listening devices 130. This can create further independence from host device 110 by not requiring the user to physically interact with, and/or look at the display screen of, host device 110, especially when the functionality of wireless listening devices 130 is combined with the voice control capabilities of host device 110. Thus, wireless listening devices 130 can enable a true hands free experience for the user.

In some embodiments user input to wireless listening devices 130, and thus to host device 110, can be realized through one or more microphones (not shown in FIG. 1) and/or a multifunction button 136. The multifunction button 136 can be, for example, a rocker switch that allows a user to input different commands based on the location that the user touches rocker button and the duration for which the multifunction button is depressed.

Housing 132 can also include electrical contacts 142, 144 disposed along an exterior surface of the housing for making contact with corresponding electrical contacts in charging case 150. In some embodiments contacts 142, 144 can be flush with an exterior surface of housing 132 and tightly sealed with the housing to prevent moisture or particles from entering the housing through the openings for the contacts.

Figure 2:
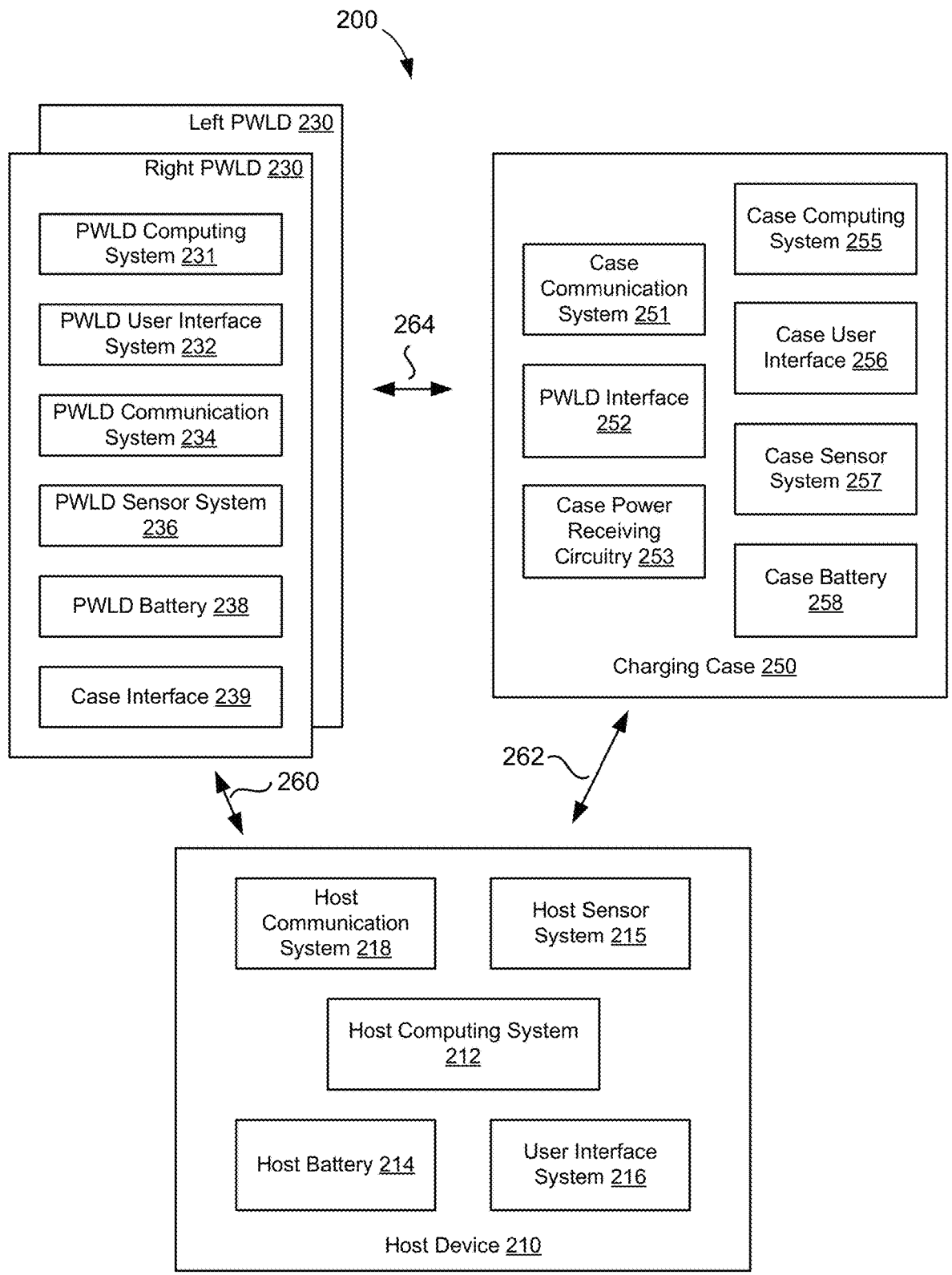
FIG. 2 is a simplified block diagram of various components of a portable wireless listening system according to some embodiments.

FIG. 2 is a simplified block diagram of various components of a wireless listening system 200 according to some embodiments that includes a host device 210, a pair of portable wireless listening devices (PWLDs) 230 (e.g., a right PWLD 230 and a left PWLD 230) and a charging case 250. System 200 can be representative of system 100 shown in FIG. 1 and host device 210, portable wireless listening devices 230 and charging case 250 can be representative of host device 110, portable wireless listening devices 130 and charging case 150, respectively. Each portable wireless listening device 230 can receive and generate sound to provide an enhanced user interface for host device 210. For convenience, the discussion below refers to a single portable wireless listening device 230, but it is to be understood that, in some embodiments, a pair of portable listening devices can cooperate together for use in a user's left and right ears, respectively, and each portable wireless listening device in the pair can include the same or similar components.

Portable wireless listening device 230 can include a computing system 231 that executes computer-readable instructions stored in a memory bank (not shown) for performing a plurality of functions for portable wireless listening device 230. Computing system 231 can be one or more suitable computing devices, such as microprocessors, computer processing units (CPUs), digital signal processing units (DSPs), field programmable gate arrays (FPGAs), application specific integrated circuits (ASICs) and the like.

Computing system 231 can be operatively coupled to a user interface system 232, communication system 234, and a sensor system 236 for enabling portable wireless listening device 230 to perform one or more functions. For instance, user interface system 232 can include a driver (e.g., speaker) for outputting sound to a user, one or more microphones for inputting sound from the environment or the user, one or more LEDs for providing visual notifications to a user, a pressure sensor or a touch sensor (e.g., a resistive or capacitive touch sensor) for receiving user input, and/or any other suitable input or output device. In some embodiments, user interface 232 can include a multifunction button, such as multifunction button 136.

Communication system 234 can include wireless and wired communication components for enabling portable wireless listening device 230 to send and receive data/commands from host device 210. For example, in some embodiments communication system 234 can include circuitry that enables portable wireless listening device 230 to communicate with host device 210 over wireless link 260 via a Bluetooth or other wireless communication protocol. In some embodiments communication system 234 can also enable portable wireless listening device 230 to wirelessly communicate with charging case 250 via wireless link 264. Sensor system 236 can include optical sensors, accelerometers, microphones, and any other type of sensor that can measure a parameter of an external entity and/or environment.

Portable wireless listening device 230 can also include a battery 238, which can be any suitable energy storage device, such as a lithium ion battery, capable of storing energy and discharging stored energy to operate portable wireless listening device 230. The discharged energy can be used to power the electrical components of portable wireless listening device 230. In some embodiments, battery 238 can be a rechargeable battery that enables the battery to be repeatedly charged as needed to replenish its stored energy. For instance, battery 238 can be coupled to battery charging circuitry (not shown) that is operatively coupled to receive power from charging case interface 239. Case interface 239 can, in turn, electrically couple with PWLD interface 252 of charging case 250. In some embodiments, power can be received by electrical contacts from charging case 250 via electrical contacts within case interface 239 (e.g., contacts 142, 144 at an exterior surface of portable wireless listening device 230). In some embodiments, power can be wirelessly received by portable wireless listening device 230 via a wireless power receiving coil within case interface 239.

Charging case 250 can include a battery 258 that can store and discharge energy to power circuitry within charging case 250 and to recharge the battery 238 of portable wireless listening device 230. As mentioned above, in some embodiments circuitry within PWLD interface 252 can transfer power to portable wireless listening device 230 through a wired electrical connection between contacts in charging case 250 that are electrically coupled to contacts in portable wireless listening device 250 to charge battery 238. While case 250 can be a device that provides power to charge battery 238 through a wired interface with device 230 in some embodiments, in other embodiments case 250 can provide power to charge battery 238 through a wireless power transfer mechanism instead of or in addition to a wired connection. For example, PWLD interface 252 can include a wireless power transmitter coil that can couple with a wireless power receiving coil within portable wireless listening device 230.

In addition to providing power to portable wireless listening device 230, charging case 250 can also receive power from an external power source via power receiving circuitry 253. Case power receiving circuitry 253 can include a wired and/or a wireless power receiving interface. For example, in some embodiments, charging case 250 can include a receptacle connector (e.g., a USB-C or a lightning connector) that enables an external energy source to be directly connected to the charging case to charge battery 258 or to be connected to the charging case via an appropriate power adapter. And, in some embodiments, charging case 250 can include a wireless power receiving coil that can wirelessly receive power from a corresponding wireless power transmitter coil in a power supply external to the charging case.

Charging case 250 can also include a case computing system 255 and a case communication system 251. Case computing system 255 can be one or more processors, ASICs, FPGAs, microprocessors, and the like for operating case 250. Case computing system 255 can be coupled to PWLD interface 252 and can control the charging function of case 250 to recharge batteries 238 of the portable wireless listening devices 230, and case computing system 255 can also be coupled to case communication system 251 for operating the interactive functionalities of case 250 with other devices, including portable wireless listening device 230. In some embodiments, case communication system 251 includes a Bluetooth component, or other suitable wireless communication component, that wirelessly sends and receives data with communication system 234 of portable wireless listening device 230. Towards this end, each of charging case 250 and portable wireless listening device 230 can include an antenna formed of a conductive body to send and receive such signals.

Case 250 can also include a user interface 256 that can be is operatively coupled to case computing system 255 to alert a user of various notifications and a sensor system 257. In some embodiments, the user interface 256 can include a speaker that can emit audible noise capable of being heard by a user and/or one or more LEDs or similar lights that can emit a light that can be seen by a user (e.g., to indicate whether the portable listening devices 230 are being charged by case 250 or to indicate whether case battery 258 is low on energy or being charged). Sensor system 257 can include optical sensors, accelerometers, microphones, and any other type of sensor that can measure a parameter of an external entity and/or environment.

Host device 210, to which portable wireless listening device 230 is an accessory, can be a portable electronic device, such as a smart phone, tablet, or laptop computer. Host device 210 can include a host computing system 212 coupled to a battery 214 and a host memory bank 134 containing lines of code executable by host computing system 212 for operating host device 210. Host device 210 can also include a host sensor system 215 and a user interface 216. Sensor system 215 can include, for example, one or more of an accelerometer, a gyroscope, a light sensor, and the like, for allowing host device 210 to sense the environment, while host user interface system 216 can include, for example, one or more of a display, a speaker, buttons, a touch screen, and the like, for outputting information to and receiving input from a user.

Additionally, host device 210 can also include a host communication system 218 for allowing host device 210 to send and/or receive data from the Internet or cell towers via wireless communication, e.g., wireless fidelity (WiFi), long term evolution (LTE), code division multiple access (CDMA), global system for mobiles (GSM), Bluetooth, and the like. In some embodiments, host communication system 218 can also communicate with communication system 234 in portable wireless listening device 230 via a wireless communication link 262 so that host device 210 can send audio data to portable wireless listening device 230 to output sound, and receive data from portable wireless listening device 230 to receive user inputs. The communication link 262 can be any suitable wireless communication line such as Bluetooth connection. By enabling communication between host device 210 and portable wireless listening device 230, wireless listening device 230 can enhance the user interface of host device 210.

In-Ear Headphones

Figure 3A:
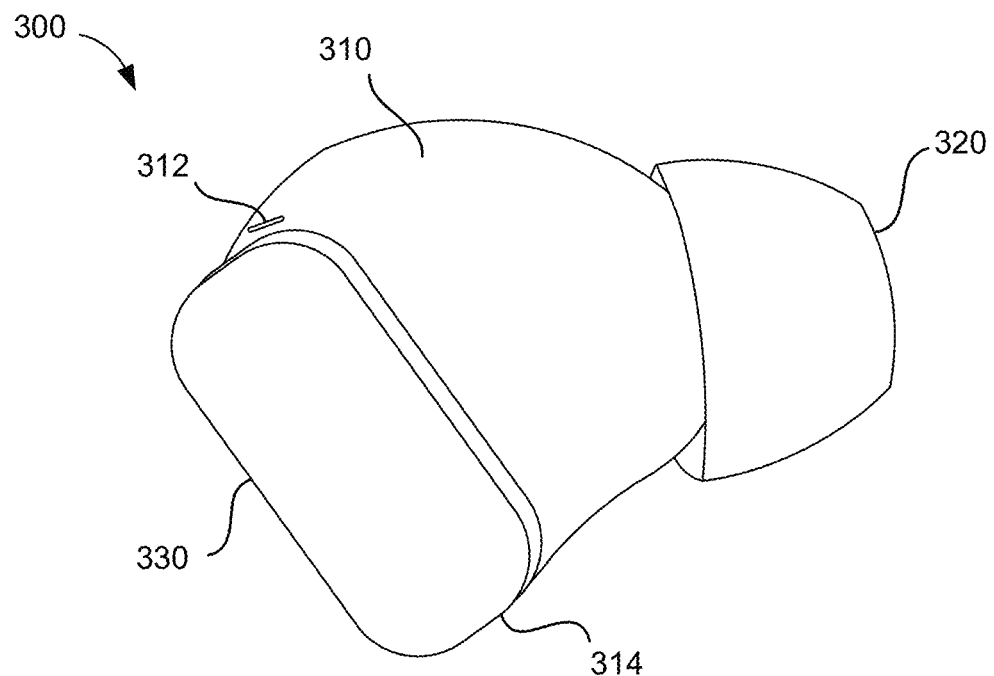
FIGS. 3A and 3B are simplified illustrations of first and second sides, respectively, of a portable wireless listening device according to some embodiments.
Figure 3B:
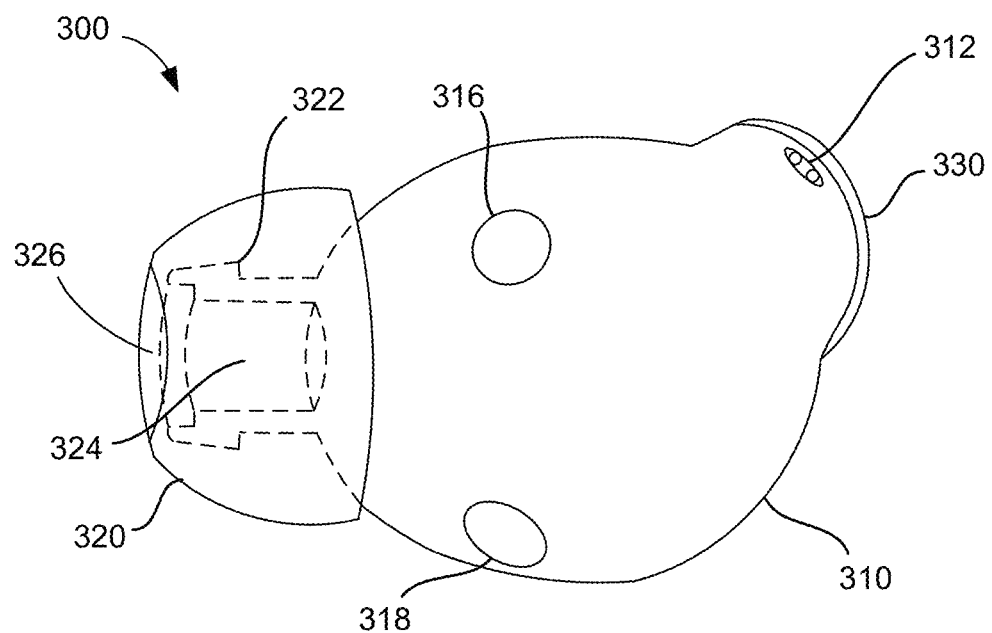

Portable wireless devices according to some embodiments can include a number of different features that provide a user with improved audio quality and a superior user experience as compared to many previously known portable wireless listening devices. To illustrate and explain some such features, reference is made to FIGS. 3A and 3B, which are simplified views of a wireless in-ear headphone 300 according to some embodiments. Specifically, FIG. 3A is a simplified plan view of a first side of in-ear headphone 300 and FIG. 3B is a simplified plan view of a second side, generally opposite the first side, of in-ear headphone 300. In-ear headphone 300 can be representative of an embodiment of personal wireless listening devices 130 discussed with respect to FIG. 1.

As shown in FIGS. 3A and 3B, in-ear headphone 300 can include a housing 310 having an ear tip 320 at one end of the housing and a multifunction button 330 positioned at an opposite end of the housing. Housing 310 can be formed of a monolithic outer structure and can include a nozzle 322 (depicted in dashed lines in FIG. 3B) to which ear tip 320 can be removably attached. An acoustic port 324 can be formed through nozzle 322 to direct sound from an internal audio driver (not shown) out of housing 310, through an opening 326 at a distal end of ear tip 320 into a user's ear canal. Ear tip 320 can be a deformable ear tip that can be inserted into a user's ear canal creating a seal within the user's ear canal and enabling the in-ear headphone 300 to have a noise canceling feature as described below.

In-ear headphone 300 can include a first microphone port 312 and a second microphone port 314 each of which provides an acoustic path from the external environment to a microphone disposed within the housing. In some embodiments, first microphone port 312 can be a relatively small opening through an external wall of housing 310 and a feed forward microphone (not shown in FIG. 3A or 3B) can be operatively coupled to receive audio waves through the microphone port 312. In some embodiments, second microphone port 314 can be formed through a multifunction input button and a voice microphone can be operatively coupled to receive audio waves through second microphone port 314. For example, microphone port 314 can be formed through bottom button housing 412 (shown in FIGS. 4 and 5A) and an acoustic path to the voice microphone can extend through a gap 512 (shown in FIG. 5A) between faceplate 412 and main housing 432, and through the microphone port 314. The feed forward microphone can receive audio waves before they reach a user's ear hear and provide input to a noise canceling circuit within in-ear headphone 300 to enable an active noise canceling feature of the in-ear headphone. The active noise canceling feature can selectively minimize distracting noise from the environment by outputting sound that specifically negates the sound received by the feed forward microphone from the external environment.

The voice microphone can be positioned to receive audio waves generated when a user is speaking so that the user's voice can be adequately captured and transmitted to a host device. In some embodiments, input from the voice microphone can also be fed into the active noise cancellation unit to improve the noise cancellation feature. Additionally, the first and second microphone ports can be positioned at locations along housing 310 that maximize the performance of the feed forward and voice microphones. For example, first microphone port 312 can be positioned along a rear-facing portion of the housing sidewall that is unlikely to be in physical contact with any portion of a user's ear when in-ear headphone 300 is inserted into the ear canal and that presents a reduced potential of obstruction with a user's fingers when engaging with the headphone. Additionally, having the feed forward and voice microphones spaced apart on opposite sides of housing 310 enables the audio processor (e.g., portable wireless listening device computing system 231) within in-ear headphone 300 to utilize beam forming techniques to improve the signal-to-noise ratio when capturing a user's speech or other sounds by, for example, isolating the user's speech from background noises.

Housing 310 can also include electrical contacts 316, 318 disposed along an exterior surface of the housing. The electrical contacts can be positioned such that, when in-ear headphone 300 is stored in an appropriate charging case, the electrical contacts 316, 318 can be in physical contact with and electrically coupled to electrical contacts disposed within the charging case enabling the in-ear headphone to receive power from the charging case to charge a rechargeable battery within the in-ear headphone 300 as discussed further below.

Internal Components

Figure 4:
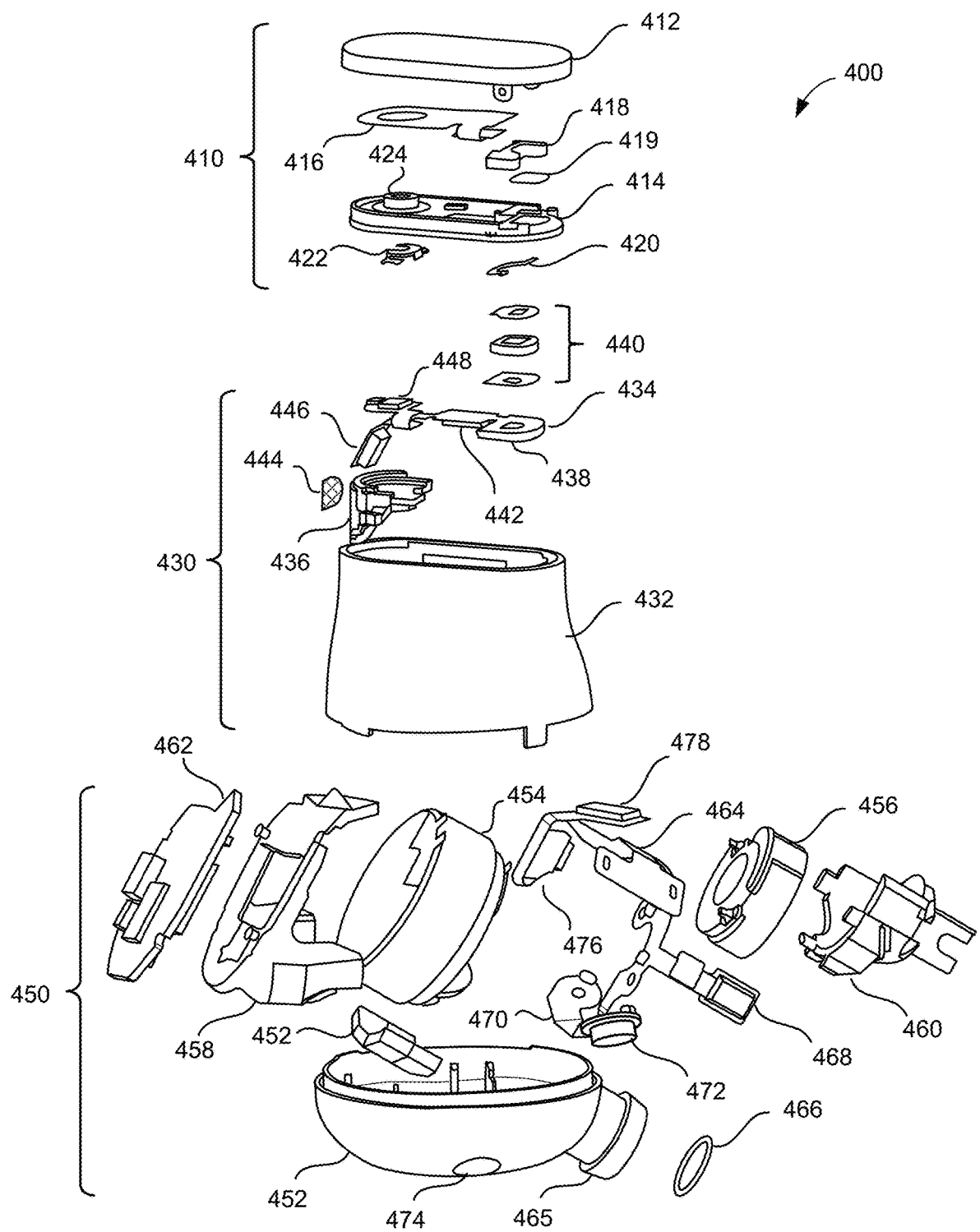
FIG. 4 is a simplified exploded view of a portable wireless listening device according to some embodiments.

FIG. 4 is a simplified exploded view of a wireless in-ear headphone 400 according to some embodiments that can be representative of wireless in-ear headphone 300. As depicted in FIG. 4, wireless in-ear headphone 400 includes three primary sub-assemblies that combine together to form the in-ear headphone including: a faceplate assembly 410, a main housing assembly 430 and an audio driver housing assembly 450. While not labeled in FIG. 4 as such, when fully assembled, wireless in-ear headphone 400 can include the same primary components discussed above with respect to wireless in-ear headphone 300 including a housing 310, an EARTIP 320 (not shown in FIG. 4) and a multifunction button 330.

Faceplate housing assembly 410 includes various components that define a multifunction button that can be operable to receive user input as described with respect to multifunction button 330. The faceplate housing assembly 410 can include a top button housing 412 (sometimes referred to herein as a "faceplate 412") and a bottom button housing 414. The bottom button housing can be permanently affixed to main housing 432 described below and faceplate 412 can be coupled to bottom housing 414 by retention features 420 and 422 as discussed below.

A wireless antenna flex 416 can be positioned in the space between bottom housing 414 and faceplate 412. Placing the antenna flex 416 near an outer extremity of the in-ear headphone (i.e., near a top portion of faceplate 412) provides separation between the antenna and the majority of the processing components within the in-ear headphone. In some embodiments, antenna flex 416 can be disposed in a portion of faceplate assembly 410 that is outside a sealed cavity and thus partially exposed to the environment. As shown in FIG. 4, antenna flex 416 can include a circular opening at one end through which a gasket 424 that seals off a plunger portion (shown in FIG. 7A as plunger 622) of faceplate 412 can extend as discussed below. In some embodiments bottom button housing 414 and gasket 424 can be formed with a two shot process where the first shot forms the bottom button housing 414 and the second shot forms the gasket 424. In some particular implementations, the bottom button housing can be a rigid plastic material and the second shot that forms gasket 424 can be, for example, a thermoplastic elastomer material that allows for some flex in the faceplate assembly when the multifunction button is depressed.

Faceplate housing assembly can also include a gasket 418 and a mesh 419. Gasket 418 biases faceplate 412 upwards and provides internal spacing between the top and bottom button housings. Mesh 419, which can fit within two opposing legs of gasket 418, covers an acoustic opening (e.g., second microphone port 314) that extends through bottom housing 414 to voice microphone 438 and, in some embodiments, prevents the ingression of moisture or other contaminants passing through the acoustic opening. Retention features 420 and 422 can coupled faceplate 412 to bottom housing 414. In some embodiments, retention feature 420 can be an axle that provides an axis of rotation for the multifunction switch and retention feature 422 can be a clip as discussed in more detail with respect to FIGS. 7A-7C.

Main housing assembly 430 includes a main housing 432 that, in addition to being bonded to bottom button housing 414, can also be bonded to a speaker housing 452 portion of the speaker housing assembly 450. Together, main housing 432, speaker housing 452 and bottom button housing 414 define a primary internal cavity (cavity 505 discussed with respect to FIGS. 5A and 5B) for wireless in-ear headphone 400 in which the other various components of main housing assembly 430 and speaker housing assembly 450 are positioned.

Main housing assembly 430 can also include a bridge flex circuit 434 that is supported by a bridge frame 436, a mesh 444 that covers a microphone port (e.g., first microphone port 312) to protect the feed forward microphone 446 and a set of elements 440 that are part of the voice microphone stack and help define the geometry of the voice microphone port 314. Bridge frame 436 can fit against the sidewall of main housing 432 and creates the internal geometry for the feed forward microphone 446. Bridge flex 434 can include switch 448 of the multifunction button, the voice and feed forward microphones 438 and 446, respectively, and a board-to-board connector 442 that ties back to the main logic board 462 discussed below.

Speaker housing assembly 450 includes, in addition to speaker housing 452 discussed above, an audio driver 456 (i.e., a transducer), a rechargeable battery 454 and a multilayer board 462 among other elements. Audio driver 456 can sit within a transducer frame 460 that aligns the audio driver 456 with nozzle 465 so that sound generated by audio driver 456 is directed out of nozzle 465. A protective mesh 466 can cover nozzle 465 and prevent particles and moisture from penetrating into the primary internal cavity. In some embodiments, protective mesh 466 can be a multilayer mesh that includes a hydrophobic mesh that enables mesh 466 to resist the ingress of water and other types of moisture into the housing and a structural mesh.

A flex circuit 464 sits between battery 454 and audio driver 456 and provides a mounting point for electrical contacts 470, 472, which can be representative of contacts 316, 318 discussed above. The electrical contacts 470, 472 are aligned to fit within corresponding contact openings 474 (only one of which is visible in FIG. 4) in the driver housing 452. A feedback microphone 468 can also be mounted on the flex circuit 464 and positioned within a front volume of the audio driver 456 as discussed with respect to FIGS. 5A and 5B below. Flex circuit 464 can also include two board-to-board connectors 476, 478 that provide connections between the flex circuit 464 and the main logic board 462 and bridge flex circuit 434, respectively.

A separate, MLB frame 458 can support the multilayer board 462 one a first side of the frame 458 and can fit over battery 454 on a second side of the frame 458. And, a retention magnet 480 can be positioned fitted against speaker housing 452. Retention magnet 480 can be aligned to cooperate with magnets within a corresponding charging case and act as the primary retention feature of wireless in-ear headphone 400 to retain the in-ear headphone within the charging case as discussed below.

Acoustic Volumes

Figures 5A, 5B:
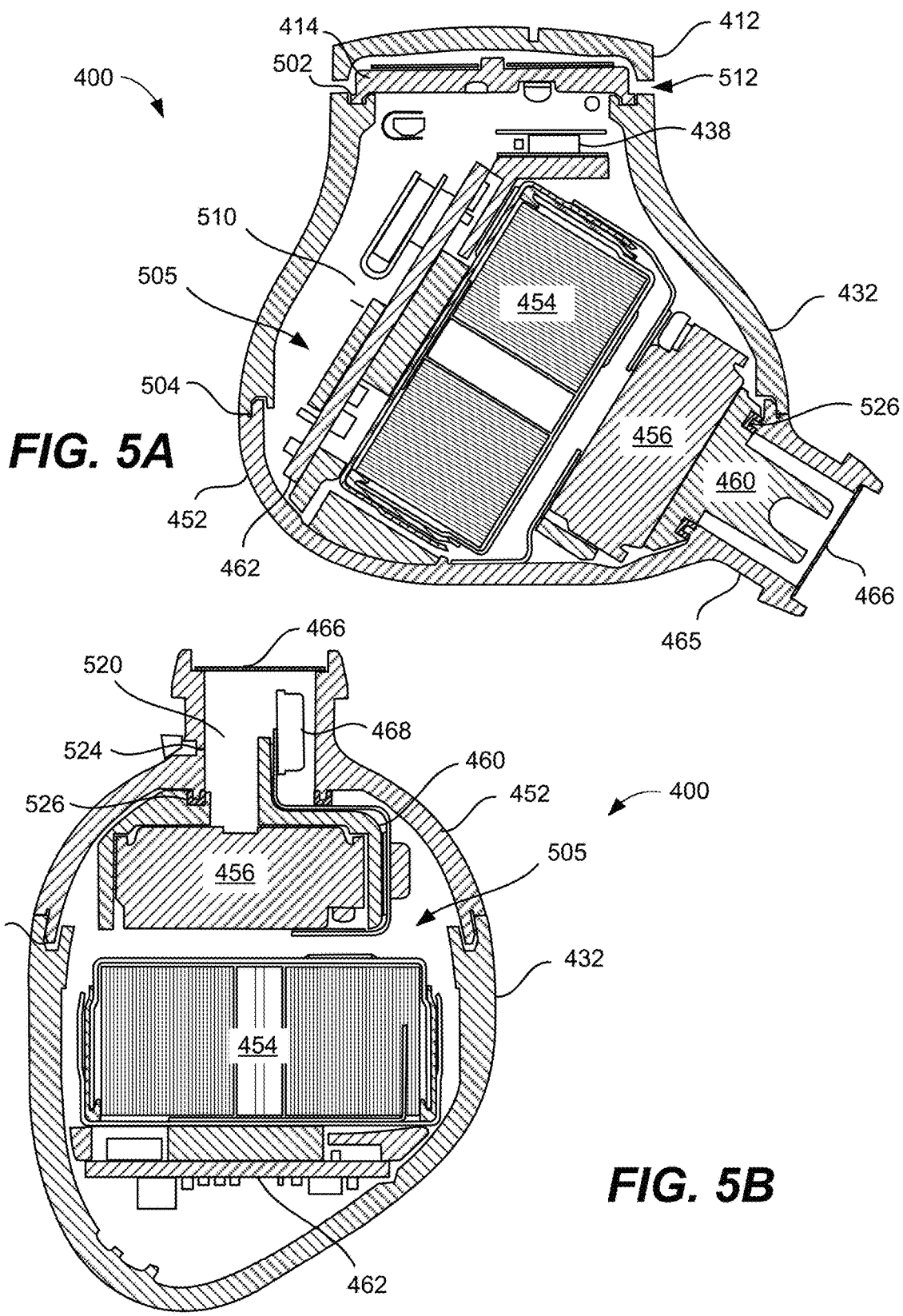
FIGS. 5A and 5B are simplified cross-sectional views, taken along different planes, of the portable wireless listening device depicted in FIG. 4.

As mentioned above, main housing 432, speaker housing 452 and bottom button housing 414 define a primary internal cavity 505 for wireless in-ear headphone 400 that is shown more clearly in FIGS. 5A and 5B, which are simplified cross-sectional views, taken along different planes, of portable wireless listening device 400. The various housing components (bottom button housing 414, primary housing 432 and speaker housing 452) can be chemically bonded or otherwise adhered together at annular junctions 502 and 504 in a manner such that overall in-earphone housing (e.g., housing 310) is essentially a unitary, monolithic structure that can have a substantially seamless appearance. For example, bottom button housing 414 can be bonded to primary housing 432 at annular junction 502 and primary housing 432 can be bonded to speaker housing 452 at annular junction 504. In some embodiments, annular junctions 502, 504 can have a tongue and groove geometry that further strengthens the bonds between adjacent parts.

Internal cavity 505 both houses battery 454, audio driver 456 and other components, and provides space for both a back volume 510 and a front volume 520 for wireless in-ear headphone 400. Transducer frame 460 is sealed off against audio driver 456 and nozzle 465 defining a boundary for front volume 520 that extends through nozzle 465 between a user's ear canal (when the in-ear headphone is in use) and audio driver 456. An O-ring 526 provides a seal between walls of speaker housing 452 and transducer frame 460 and an internal microphone 522 can be positioned within nozzle 465 and attached to a portion of the driver housing. A barometric vent 524 can extend through a sidewall of nozzle 465 fluidly coupling the external environment to front volume 520. The barometric vent 524 enables allowing pressure within the front volume that might otherwise be trapped in the ear canal and be uncomfortable to a user to leak out through the vent 524.

Back volume 510 extends from the outer edges of transducer frame 460 past the sidewalls and rear surface of driver 456 and encompassing the remainder of the space within primary cavity 505 that is not filled with components.

Multi-Function Button

In some embodiments, wireless in-ear headphone 400 can include a multi-function button 330 that enables a user to control certain features of the wireless in-ear headphone with a single button instead of multiple separate input buttons. In some embodiments, multifunction button 330 can be a rocker switch that can be activated to invoke different functions controlled by a host device wirelessly coupled to communicate with headphone 400 based on the number of times the button is depressed in rapid succession and/or the length of time that the button is depressed. For example, in one particular implementation, depressing the button a single, relatively short time (a single click) can invoke a "play/pause" command for music being streamed to the in-ear headphone by the host device, rapidly depressing the button twice in succession (a double click) can invoke a "next track" command, rapidly depressing the button three times in succession (a triple click) can invoke a "previous track" command and depressing the button for a relatively long continuous amount of time (e.g., half a second or more) can activate a digital voice assistant that can accept additional commands from a user via one of the microphones on headphone 400.

Figure 6A:
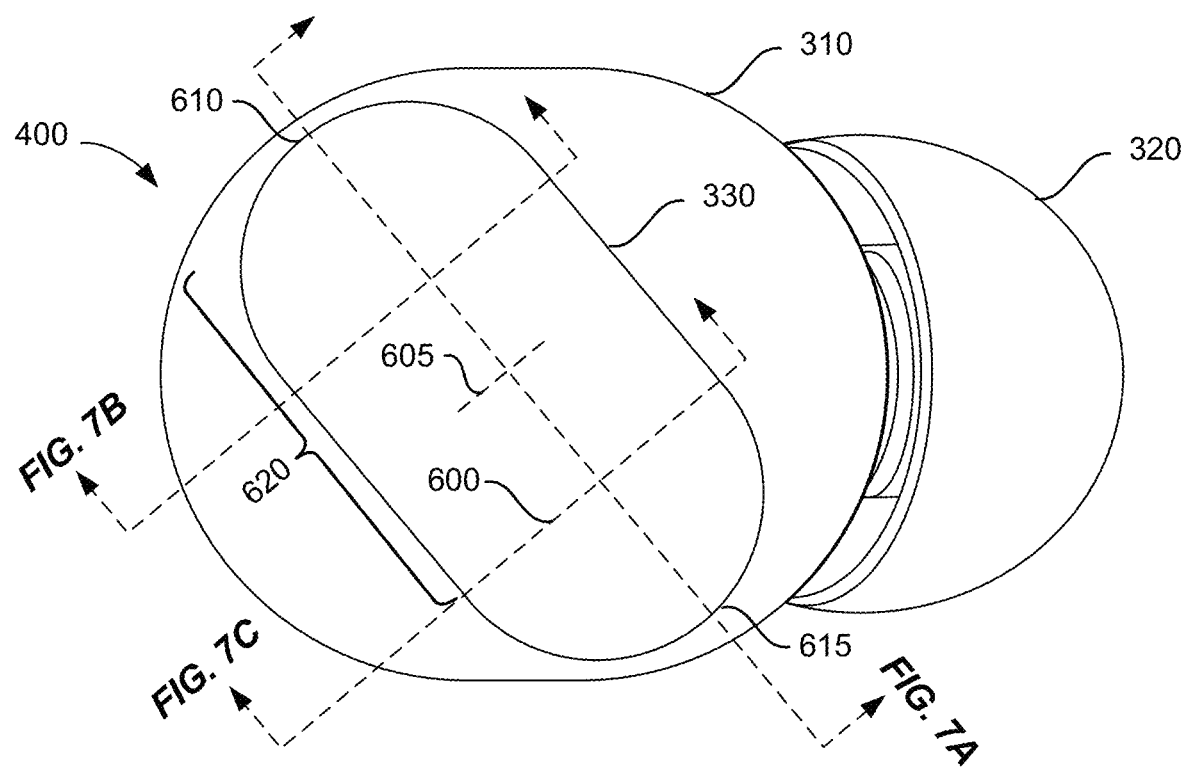
FIG. 6A is a simplified view of the portable wireless listening device depicted in FIG. 4 looking towards multi-function button 330.
Figure 6B:
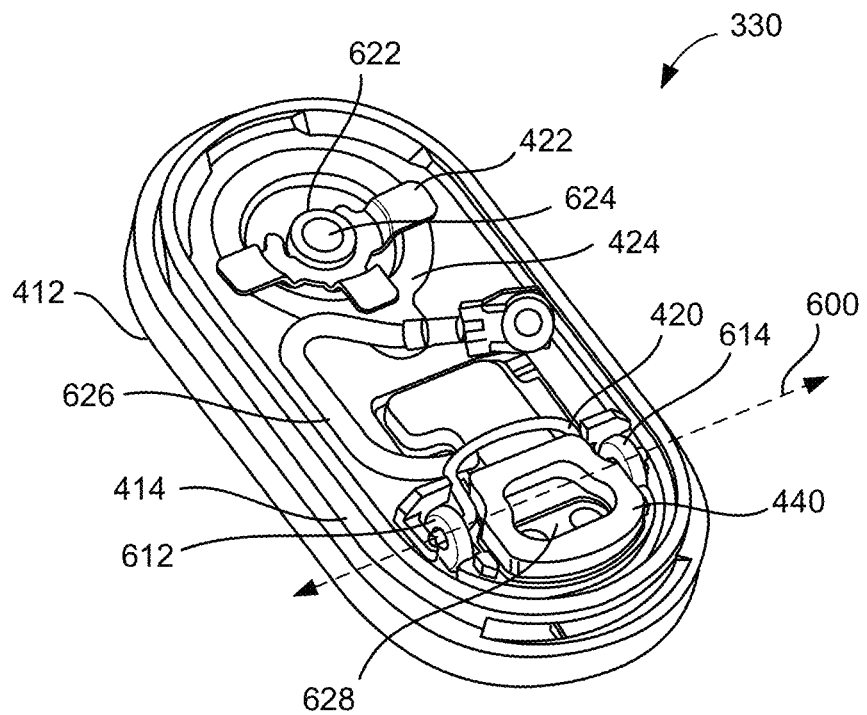
FIG. 6B is a simplified perspective view of a bottom portion of the faceplate assembly depicted in FIG. 4 as viewed from a bottom portion of the button.
Figure 7A:
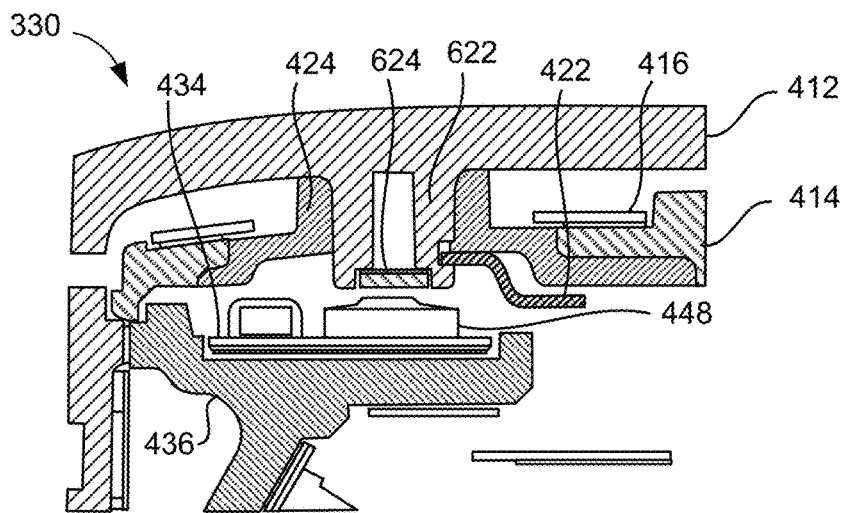
FIGS. 7A-7C are simplified cross-sectional views, taken along different planes, of the faceplate assembly depicted in FIG. 6A.
Figure 7B:
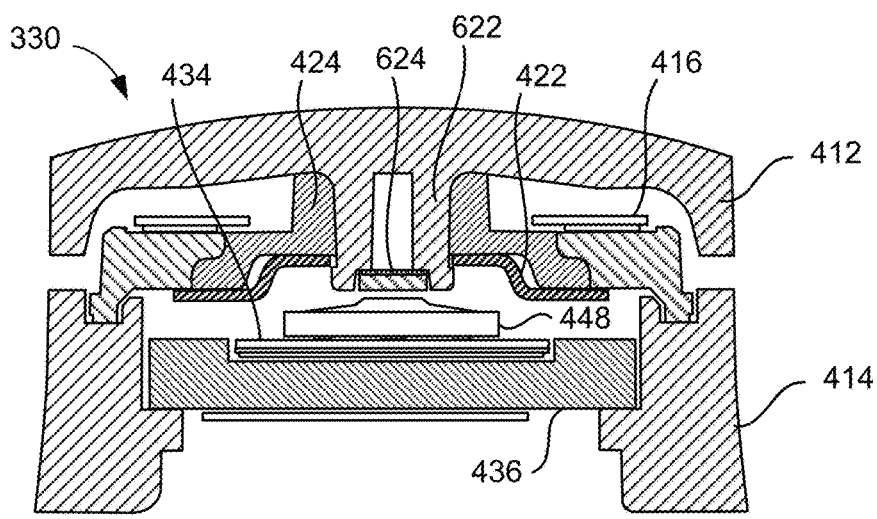
Figure 7C:
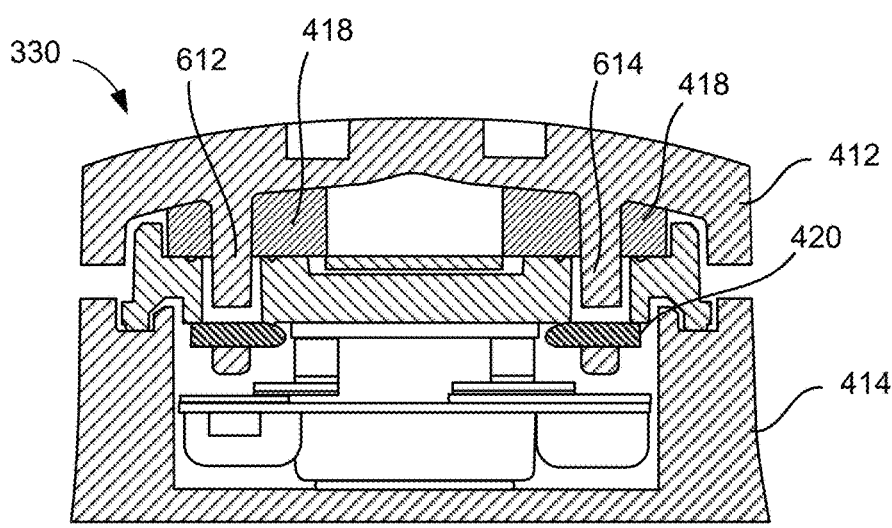

One implementation of multifunction button 330 is shown in FIGS. 6A, 6B and FIGS. 7A-7C in which FIG. 6A is a simplified view of multifunction button 330 flipped over (i.e., looking from the inside of the multifunction button towards the outer faceplate 412 of the button); FIG. 6B is a simplified internal perspective view of multifunction button 330 looking from a bottom portion of the button towards faceplate 412; and FIGS. 7A-7C are simplified cross-sectional views, taken along different planes, of the faceplate assembly as indicated in FIG. 6A.

Referring first to FIGS. 6A and 6B, faceplate 412 includes two ribs 612, 614 that have corresponding holes through which wireform axle 420 extends and butts up against the lower housing 414. The wireform axle 420 sets a pivot point 600 for multifunction button 330 through the ribs 612, 614, that in some embodiments is shifted towards one end of button 330 and can coincide with the dashed line indicating the location of the cross-section shown in FIG. 7C. At the other end of button 330, the switch for the multifunction button 330 can be positioned directly below the intersection of the dashed lines indicating the locations of the cross-sections for FIGS. 7A and 7B, respectively. In some embodiments, multifunction button 330 can have a center line 605 located between a distal end 610 and a proximal end 615 of the button. Pivot point 600 can be positioned away from center line 610 towards the proximal end 615 and thus can be said to be located within a portion of the multifunction button between the center line and proximal end. Having pivot point 600 located towards on end of button 330 (as opposed to being located on the centerline) enables an area of activation 620 for the button anywhere from pivot point 600 to distal end 610 of the button 330.

Retention clip 422 and wireform axle 420 permanently affix the bottom button housing 414 to the faceplate 412 and the entire faceplate assembly 410 can be affixed to primary housing 432 with, for example, a mechanical tongue and grove joint 502 (shown in FIG. 5A) and an appropriate adhesive. A plastic plunger 622, which can be formed as part faceplate 412, projects away from faceplate 412 towards bottom housing 414 and sits between gasket 424 and a shim 624. When faceplate 412 is depressed in the activation area 620 of multifunction button, plunger 622 is pushed towards bottom housing 414 and activates switch 448. Also shown in FIG. 6B is a coax cable 626 that comes off the wireless antenna flex and microphone port 628 for the feed forward microphone 446.

FIGS. 7A and 7B are cross-sectional views of multifunction button 330 taken through the area that includes plunger 622 and switch 448 where the cross-sectional view in FIG. 7B is rotated 90 degrees from the cross-sectional view of FIG. 7A. As shown in each of FIGS. 7A and 7B, a switch 448 is mounted on bridge flex 434, which sits atop and can be bonded to, bridge frame 436 by a PSA layer. While not shown in FIG. 7A or 7B, bridge frame 436 can creates a geometry for the feed forward microphone. A bottom edge of plunger 622 is positioned directly above switch 448 so that when faceplate 412 is depressed, plunger 622 come in physical contact with and activates the switch 448. The plunger 622 sits within an annular opening of gasket 424 that provides a seal between the two components.

FIG. 7C is a cross-sectional view of multifunction button 330 taken through the pivot point 600. Wireform axle 420 is shown in FIG. 76 protruding through the two ribs 612, 614. Gasket 418, which allows for a constant preload at the pivot end of faceplate 412 to ensure that the axle 420 is hard stocked to the underside of the faceplate to help set a gap between the faceplate and bottom button housing 414.

Charging Case

Some embodiments of the disclosure pertain to a charging case that can store and charge a portable wireless listening device or a pair of portable wireless listening devices, such as a pair of in-ear headphones 300. The charging case can protect the wireless listening devices from physical damage as well as provide a source of power for charging the wireless listening devices.

Figure 8A:
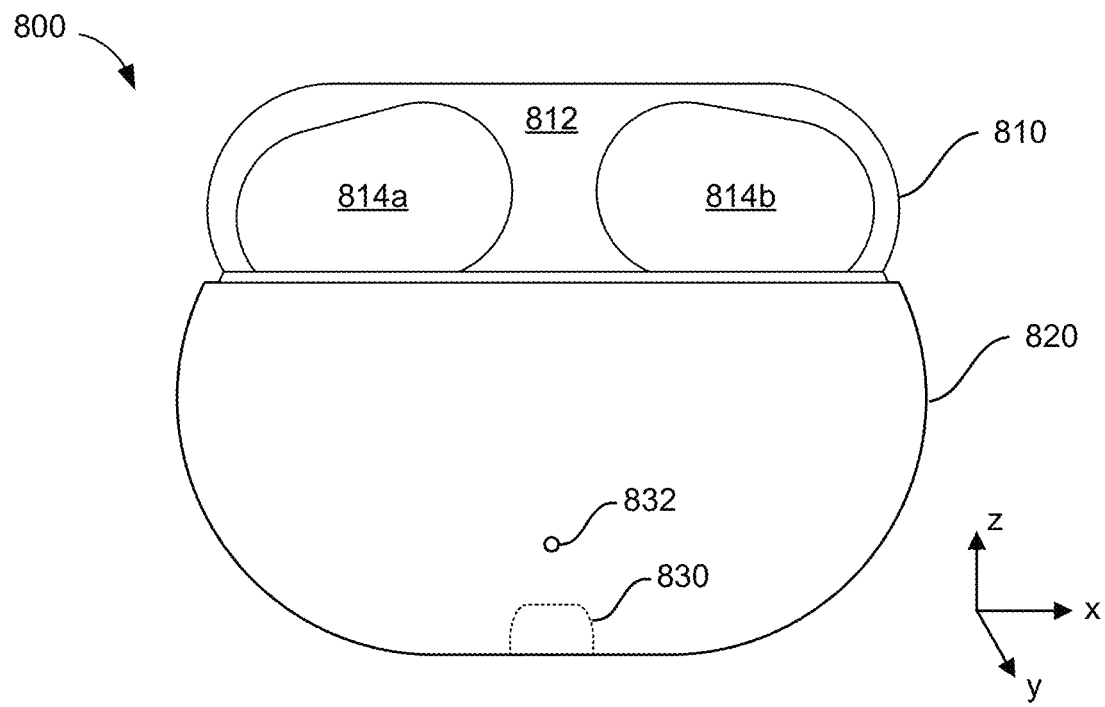
FIG. 8A is a simplified front side view of a charging case for a pair of portable wireless listening devices according to some embodiments with a lid of the charging case in an open position.
Figure 8B:
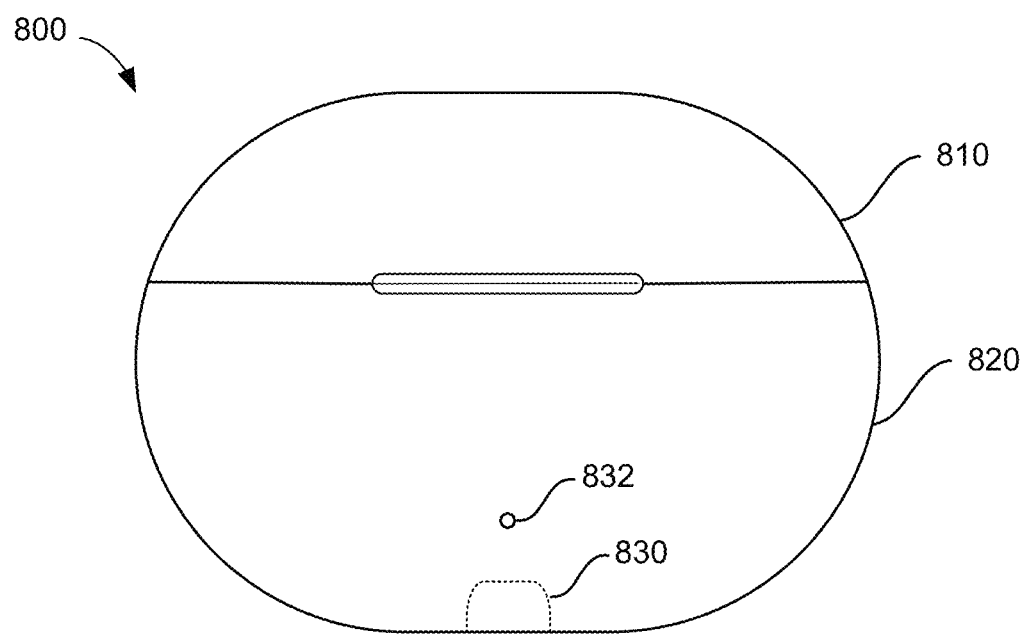
FIG. 8B is a simplified front side view of the charging case depicted in FIG. 8B with its lid in a closed position.

FIGS. 8A and 8B are simplified plan views of a charging case 800 that can store a pair of portable wireless listening devices, such as in-ear headphones 300, according to some embodiments. As shown in each of FIGS. 8A and 8B, charging case 800 can include a lid 810 and a body 820 that forms an internal cavity for housing the pair of in-ear headphones, or other portable wireless listening devices, that can be worn in a user's left and right ears, respectively. FIG. 8A is a simplified front side view of charging case 800 according to some embodiments with lid 810 of the charging case in an open position and FIG. 8B is a simplified front side view of charging case 800 with lid 810 in a closed position.

Lid 810 can be attached to body 820 by a hinge (not shown in FIG. 8A or 8B) that enables the lid to be moved between an open position (in which the pair of in-ear headphones can be inserted into or removed from case 800) and a closed position (in which the lid 810 covers the pair of in-ear headphones thereby completely enclosing the headphones within the charging case 800). In some embodiments, the hinge can include a torsion spring that biases lid 810 to an open position. Magnetic elements in the lid and body cooperate to hold the lid in a close position. Once the lid is opened enough to have the torsion spring force overcome the strength of the magnets, the torsion spring flips the lid to the fully open position. Also, in some embodiments the hinge can be a bistable hinge that has two stable states: an open state and a closed state. Between the open and closed states, the hinge can have a neutral position where it does not pull to open or close the lid, but once the lid moves in one direction past the neutral position, the bistable hinge will either pull the lid open or pull the lid closed depending on which direction away from the neutral position the lid is moved.

In some embodiments, charging case 800 can include an internal frame (not visible in either of FIG. 8A or 8B) within body 820 including portions designed to provide contours and surface features against which the pair of in-ear headphones can rest in strategic positions to minimize the size of case 800. The internal frame can also establish an upper surface 822 (see FIG. 9A) of body 820 that includes two contoured pockets for left and right in-ear headphones, respectively. Similarly, the charging case can also include an internal frame that fits within lid 810 to provide a lower surface to the lid that includes two contoured upper pockets 814a, 814b that an upper portion of the left and right in-ear headphones fit within, respectively, when lid 810 is closed.

Figure 9A:
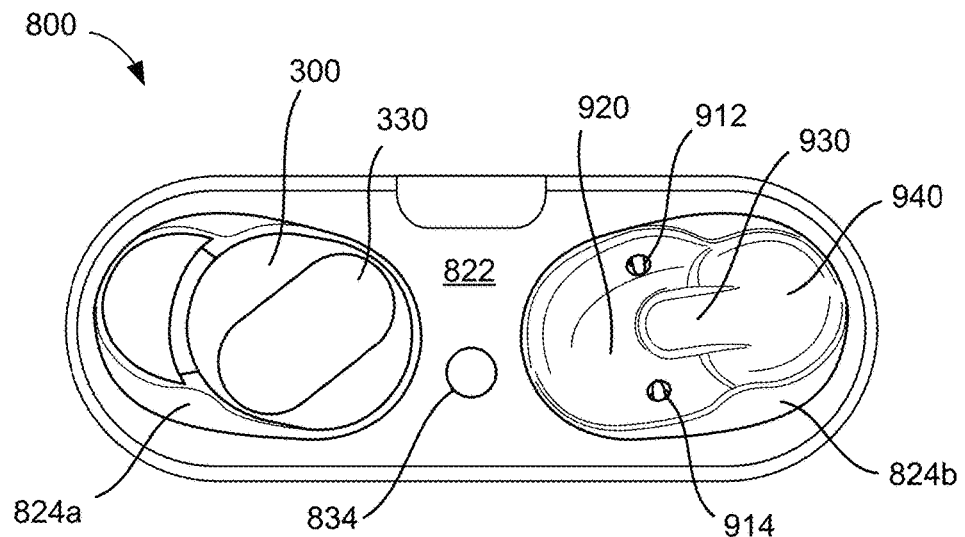
FIG. 9A is a simplified top view of the charging case depicted in FIGS. 8A and 8B shown without its lid and with a portable wireless charging device stored in one of the charging case's pockets.

Case 800 can be configured to charge a pair of wireless in-ear headphones when the in-ear headphones are housed within the charging case. Towards this end, in some embodiments case 800 can include two pairs of electrical contacts (e.g., one pair of contacts 912 and 914 are shown in FIG. 9A) for making electrical contact with respective contacts at the external surface of each in-ear headphone earbud so that charge can flow from an internal battery (not shown) of charging case 800 to internal batteries of the in-ear headphones. In some embodiments, each of the charging case contacts can include an electrically conductive pin that sits within a circular gasket that can be over molded around the pin. The gasket and pin can be supported by one side of a contact housing that has spring operatively coupled to an opposing side of the housing to bias the pin into the pocket and ensure a strong physical and electrical connection with a corresponding contact on the in-ear headphone.

The charging case internal battery can be charged by an external power supply that is electrically coupled to case 800 via a connector 830. Connector 830 can be any appropriate physical connector interface, such as a lightning connector port developed by Apple, a USB-C port, a mini USB port or the like. In some embodiments charging case 800 also includes a wireless power receiving coil (not shown) to wirelessly receive power that can be used to charge the internal battery as discussed in more detail below.

Charging case 800 can also include a visual indicator 832 configured to emit different colors of light. Visual indicator 832 can change colors depending on the charge status of the case. As an example, indicator 832 can emit green light when the case is charged, emit orange light when the charging case battery is charging and/or when the charging case battery has less than a full charge, and red light when the charging case battery is depleted. When viewed from outside of case 800, visual indicator 832 can have a circular shape, or any other suitable shape, such as square-like, rectangular, oval, and the like. Case 800 can also include a user-interface 834 (see FIG. 9A), such as a button, that when activated and when the in-ear headphones are stored within case 800 with lid 810 open, initiates a pairing routine that allows the in-ear headphones to be paired with a host device.

Pocket Troughs

Figure 9B:
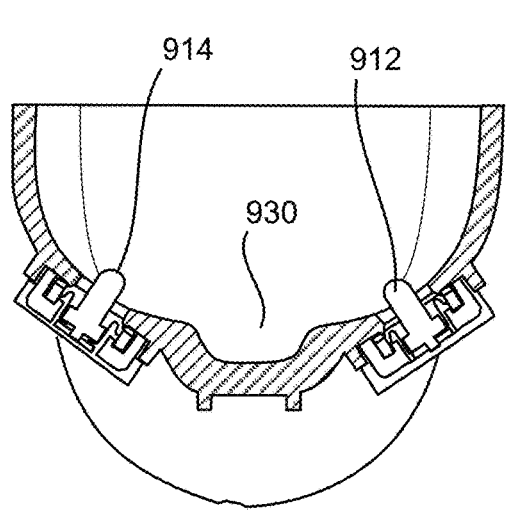
FIGS. 9B and 9C are simplified cross-sectional perspective views of a bottom portion of one of the pockets in the charging case depicted in FIG. 9A.
Figure 9C:
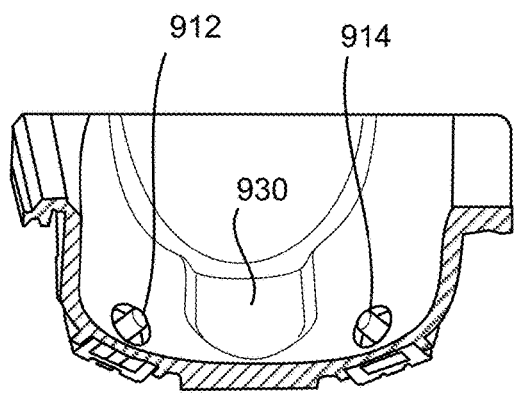

Reference is now made to FIGS. 9A-9C in which FIG. 9A is a simplified top view of the charging case 800 shown without lid 810 and with an in-ear headphone 300 stored in one of the charging case's pockets, and FIGS. 9B and 9C are simplified cross-sectional perspective views of a bottom portion of one of the pockets in charging case 800. Charging case 800 includes two pockets 824a, 824b for storing left and right in-ear headphones, respectfully. As shown in FIG. 9A, an in-ear headphone 300 is stored in pocket 824a while pocket 824b is empty and ready to accept a second in-ear headphone 300.

Charging case 800 and wireless in-ear headphone 300 can be proportioned and designed such that faceplate 330 for each in-ear headphone 300 stored in the charging case is disposed at the top of the in-ear headphone (i.e., the faceplate is presented to a user) and the charging contacts 316, 318 are disposed at the bottom of the in-ear headphone when the wireless in-ear headphone 300 is stored in the charging case.

In some embodiments, each pocket 824a, 824b is contoured such that the pocket includes an upper section 920 and a lower section 940. Additionally, a trough 930 can be formed at the bottom surface of upper section 920 proximate the charging case contacts 912, 914. The trough 930 can provide a continuous ramped surface extending from upper section 920 to lower section 940 to facilitate the movement of sweat or other liquids that might collect on the wireless in-ear headphone and drip into the pocket away from contacts 316, 318 on the in-ear headphone 300 and away from contacts 912, 914 in the charging case 800. Transporting moisture away from both sets of contacts in this manner can help prevent possible corrosion of the contacts. Additionally, referring back to FIG. 3B, charging contacts 316, 318 can be positioned as far apart as possible from each other as housing 310 allows (e.g., at opposing edges of the housing) while still facing the same general direction. When the in-ear headphones are stored in the charging case, such positioning of the charging contacts allows the contacts to be at the bottom of the in-ear headphone 300 and on opposing sides of trough 930 and allows the width of trough 930 to be as wide as reasonably possible to collect and transport a higher volume of moisture away from the contacts.

Retention Magnets

Figure 10:
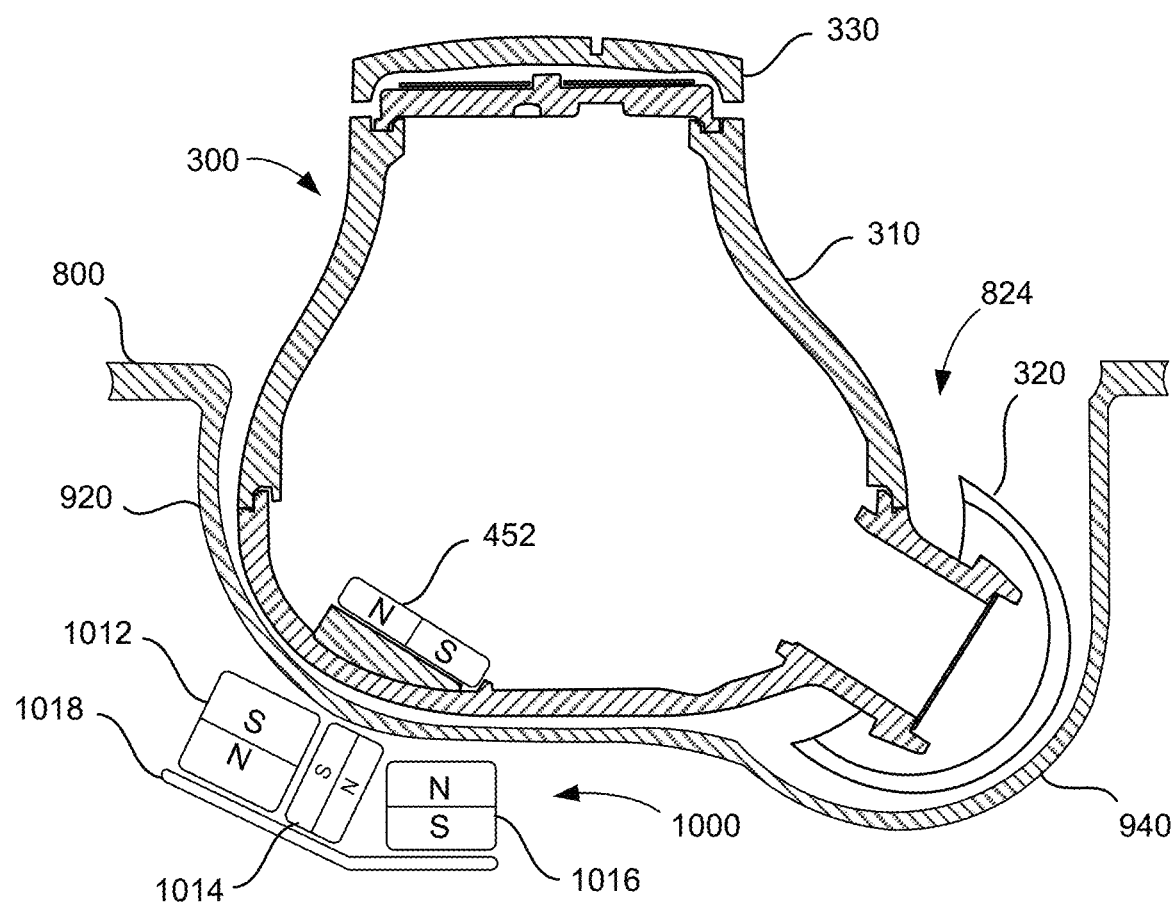
FIG. 10 is a simplified partial cross-sectional view of wireless in-ear headphone positioned within a pocket of charging case depicted in FIG. 10.

FIG. 10 is a simplified partial cross-sectional view of wireless in-ear headphone 300 positioned within a pocket 824 (e.g., one of pockets 824a, 824b) of charging case 800. As shown in FIG. 10, retention magnet 452 of the wireless in-ear headphone 300 is positioned along a bottom surface of housing 310 and aligned with a retention element 1000 disposed within the charging case adjacent to a wall that forms upper portion 920 of pocket 824. When the wireless in-ear headphone 300 is positioned within pocket 824, retention element 1000 and retention magnetic 452 cooperate to form a magnetic circuit that retains the in-ear headphone within the pocket.

In some embodiments retention element 1000 can include left and right magnets 1012, 1014, a center magnet 1016 and a shunt 1018. The magnets 1012 and 1016 can be aligned such that the poles of each magnet are attracted to the poles at opposite ends of retention magnet 452. For example, as shown in FIG. 10, retention magnet 452 can have a north pole at an upper end of the magnet 452 that aligns with magnet 1012 and a south pole at a lower end of the magnet 452 that aligns with magnet 1016. The poles of magnets 1012 and 1016 can be arranged such that a south pole is at an upper portion of magnet 1012 and a north pole is at an upper surface of magnet 1016. This arrangement creates a magnetic circuit in which flux flows from the north pole of retention magnet 452, through magnet 1012, into magnet 1016 and back to the south pole of retention magnet 452.

The center magnet 1014 can be arranged to push flux in the magnetic circuit and orient the flux in the right direction thereby increasing the strength of the magnetic field generated by the circuit. For example, center magnet 1014 can pull flux out of left magnet 1012 and push the flux into right magnet 1016. Thus, the center magnet 1014 can strengthen the magnetic circuit formed between retention element 1000 and retention magnet 452 without directly acting upon on the retention magnet 452.

Magnets 1012, 1014, 1016 can be disposed on a shunt 1018 and positioned between the shunt 1018 and pocket 824. In some embodiments, the magnets 1012, 1014, 1016 can be coupled to shunt 1018 by an adhesive layer (not shown), such as a pressure sensitive adhesive. Shunt 1018 collects flux leaving the non-acting pole of the magnet and redirects the flux into the magnetic circuit allowing the magnets in the circuit to be smaller than otherwise might be required to generate the same amount of retention force. Shunt 1018 can include a bend such that magnet 1012 and magnet 1016 are coupled to the shunt at different angles enabling the magnets to be more closely aligned with a curvature of the pocket 824 the magnets are positioned adjacent to.

Charging case 800 can include retention elements 1000 within the housing of the charging case under each of the pockets 824a, 824b. In some embodiments, the retention elements under each pocket 824a, 824b are arranged as mirror images of each other with the polarity of the magnets flipped. Similarly, the left and right wireless in-ear headphones that correspond to the charging case 800 can have the polarity of the retention magnet 452 switched between the two headphones. Thus, for example, one of the in-ear headphones 300 (e.g., a left headphone) that is intended to be stored in pocket 824a can have retention magnet 452 with poles arranged as shown in FIG. 10 while retention element 1000 adjacent pocket 824a includes magnets 1012, 1014 and 1016 having poles as also shown in FIG. 10. The other of the in-ear headphones 300 (e.g., a right headphone) that is intended to be stored in pocket 824b can have retention magnet 452 with poles opposite that shown in FIG. 10 (e.g., a south pole at the upper end of the retention magnet and a north pole at the lower end of the retention magnet) while retention element 1000 adjacent pocket 824b includes magnets 1012, 1014 and 1016 that also have poles arranged opposite of what is shown in FIG. 10 (e.g., magnet 1012 can have its south pole at an upper portion of the magnet and magnet 1016 can have its north pole at an upper end of the magnet). A mirrored and flipped arrangements of the magnets in such embodiments helps a user correctly place the left and right in-ear headphones in their dedicated and respective pockets as retention element 1000 in each pocket will attract the retention magnet 452 of the in-ear headphone that is intended to be stored in that pocket and repel the retention magnet 452 of the in-ear headphone that is intended to be stored in the other pocket.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. Also, while different embodiments of the invention were disclosed above, the specific details of particular embodiments may be combined in any suitable manner without departing from the spirit and scope of embodiments of the invention. Further, it will be apparent to one of ordinary skill in the art that many modifications and variations are possible in view of the above teachings.

Finally, it is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

What is claimed is:

1. A portable listening device comprising:
   a device housing defining an internal cavity;
   an acoustic port formed through the device housing;
   an audio driver disposed within the device housing and aligned to emit sound through the acoustic port;
   a multifunction input button coupled to the device housing, the multifunction input button having a distal end and a proximate end, a centerline between the distal and proximate ends and an axis of rotation located between the center line and the proximate end, and wherein the multifunction input button further comprises a faceplate coupled to a button housing element such that the faceplate defines an exterior surface of the portable wireless listening device and the button housing element is part of the device housing;
   an electronic circuit disposed within the device housing that requires power to operate and is configured to detect activation of the button; and
   a battery disposed within the device housing and operable to provide power to the electronic circuit; and
   wherein the faceplate is coupled to the bottom housing element by a retention clip at the distal end of the multifunction button and by a wireform axle at the proximal end of the multifunction button.

2. The portable wireless listening device of claim 1 wherein the faceplate includes plunger located between the centerline and the distal end and the multifunction input button includes a switch disposed underneath the plunger.

3. A portable listening device comprising:
   a device housing defining an internal cavity;
   an acoustic port formed through the device housing;
   an audio driver disposed within the device housing and aligned to emit sound through the acoustic port;
   a multifunction input button coupled to the device housing, the multifunction input button having a distal end and a proximate end, a centerline between the distal and proximate ends and an axis of rotation located between the center line and the proximate end, and wherein the multifunction input button further comprises a faceplate coupled to a button housing element such that the faceplate defines an exterior surface of the portable wireless listening device and the button housing element is part of the device housing;
   an electronic circuit disposed within the device housing that requires power to operate and is configured to detect activation of the button; and
   a battery disposed within the device housing and operable to provide power to the electronic circuit; and wherein the multifunction input button further comprises a gasket disposed between the faceplate and button housing element at a location between the centerline and the proximate end, wherein the gasket provides internal spacing between the faceplate and the button housing element and is operatively coupled to bias the faceplate away from the button housing element.

4. The portable wireless listening device of claim 3 wherein the gasket includes first and second legs at opposing ends of the gasket, and wherein the portable wireless listening device further includes a mesh disposed between the first and second legs and a microphone port formed through button housing element directly beneath the mesh.

5. The portable wireless listening device of claim 3 further comprising a wireless antenna disposed between the faceplate and the button housing element.

6. A portable listening device comprising:
a device housing defining an internal cavity;
an acoustic port formed through the device housing;
an audio driver disposed within the device housing and aligned to emit sound through the acoustic port;
a multifunction input button coupled to the device housing, the multifunction input button having a distal end and a proximate end, a centerline between the distal and proximate ends and an axis of rotation located between the center line and the proximate end;
an electronic circuit disposed within the device housing that requires power to operate and is configured to detect activation of the button; and
a battery disposed within the device housing and operable to provide power to the electronic circuit; and
wherein the internal cavity includes a front volume and a back volume for the audio driver and the portable wireless listening device further includes a feedback microphone positioned within the front volume.

7. The portable wireless listening device of claim 6 further comprising a voice microphone and a feed forward microphone positioned within the back volume.

8. The portable wireless listening device of claim 6 wherein the multifunction button further comprises a faceplate defining an exterior surface of the portable wireless listening device and having a generally planar outer surface and an oval shape.

9. The portable wireless listening device of claim 6 wherein the device housing includes a nozzle that defines the acoustic port at a first end of the device housing and a deformable ear tip removably coupled to the nozzle, and wherein the multifunction input button is disposed at a second end of the device housing opposite the first end.

10. A portable listening device comprising:
a device housing defining an internal cavity;
an acoustic port formed through the device housing;
an audio driver disposed within the device housing and aligned to emit sound through the acoustic port, the device housing and audio driver combining form a front volume and a back volume for the audio driver;
a feedback microphone positioned within the front volume;
a multifunction input button coupled to the device housing, the multifunction input button having a distal end and a proximate end, a centerline between the distal and proximate ends and an axis of rotation located between the center line and the proximate end, wherein the multifunction button comprises a faceplate coupled to a button housing element, wherein the faceplate defines an exterior surface of the portable wireless listening device and the button housing element is part of the device housing;
an electronic circuit disposed within the device housing that requires power to operate and is configured to detect activation of the button; and
a battery disposed within the device housing and operable to provide power to the electronic circuit.

11. The portable wireless listening device of claim 10 wherein the faceplate is coupled to the bottom housing element by a retention clip at the distal end of the multifunction button and by a wireform axle at the proximal end of the multifunction button.

12. The portable wireless listening device of claim 10 wherein the faceplate includes plunger located between the centerline and the distal end and the multifunction input button includes a switch disposed underneath the plunger.

13. The portable wireless listening device of claim 10 further comprising a wireless antenna disposed between the faceplate and the button housing element.

14. A portable wireless listening system comprising:
(i) a pair of earphones including a first earphone and a second earphone, each of the first and second earphones comprising:
a device housing defining an internal cavity;
an acoustic port formed through the device housing;
an audio driver disposed within the device housing and aligned to emit sound through the acoustic port;
a multifunction input button coupled to the device housing, the multifunction input button having a distal end and a proximate end, a centerline between the distal and proximate ends and an axis of rotation located between the center line and the proximate end, and further comprises a faceplate coupled to a button housing element, wherein the faceplate defines an exterior surface of the portable wireless listening device and the button housing element is part of the device housing and is coupled to the bottom housing element by a retention clip at the distal end of the multifunction input button and by a wireform axle at the proximal end of the multifunction button;
an electronic circuit disposed within the device housing that requires power to operate and is configured to detect activation of the button; and
a battery disposed within the device housing and operable to provide power to the electronic circuit; and
(ii) a case for storing and charging the pair of earphones, the case comprising:
a case body having a first pocket sized and shaped to receive the first earphone and a second pocket sized and shaped to receive the second earphone;
a lid attached to the case body and operable between a closed position where the lid is aligned over the first and second pockets and an open position that enables the first and second earphones to be placed in or removed from their respective pocket;
a battery; and
a charging system operatively coupled to the battery and configured to charge the first and second earphones when the earphones are positioned within their respective pockets.

15. The portable wireless listening device of claim 14 wherein the faceplate in each of the first and second earphones includes plunger located between the centerline and the distal end and the multifunction input button includes a switch disposed underneath the plunger.

16. The portable wireless listening system set forth in claim 14 wherein each of the first and second earphones further includes a retention magnet disposed within the earphone housing, wherein the retention magnet for the first earphone is positioned within the first earphone housing such that its north and south poles are aligned in a first orientation and the retention magnet for the second earphone is positioned within the second earphone housing such that its north and south poles are aligned in a second orientation, opposite the first orientation.

17. The portable wireless listening system set forth in claim 16 wherein:

the case for storing and charging the pair of earphones further includes first and second retention elements, the first retention element positioned within the case body adjacent to the first pocket and aligned to magnetically couple with the retention magnet of one of the earphones in the pair of earphones when the earphone is placed in the first pocket, the second retention element positioned within the case body adjacent to the second pocket and aligned to magnetically couple with one of the pair of earphones when the earphone is placed in the second pocket;

the first retention element generates a magnetic field that attracts the first retention magnet when the first earphone is placed in the first pocket and a magnetic field that repels the second earphone when the second earphone is placed in the first pocket; and the second retention element generates a magnetic field that attracts the second retention magnet when the second earphone is placed in the second pocket and a magnetic field that repels the first earphone when the first earphone is placed in the second pocket; and the multifunction button in each of the first and second earphones comprises a faceplate coupled to a button housing element, wherein the faceplate defines an exterior surface of the portable wireless listening device and the button housing element is part of the device housing.

\* \* \* \* \*